US012803567B2

(12) United States Patent
Zhao et al.

(10) Patent No.: US 12,803,567 B2
(45) Date of Patent: Nov. 17, 2026

(54) DIRECT CURRENT COMPARATOR (DCC) BRIDGE AND CURRENT SOURCE SELF-CALIBRATION METHOD THEREOF

(71) Applicant: NATIONAL INSTITUTE OF METROLOGY, CHINA, Beijing (CN)

(72) Inventors: Jianting Zhao, Beijing (CN); Yunfeng Lu, Beijing (CN); Jifeng Qu, Beijing (CN); Changwei Zhai, Beijing (CN); Yaqiong Fu, Beijing (CN); Taotao Sui, Beijing (CN)

(73) Assignee: NATIONAL INSTITUTE OF METROLOGY, CHINA, Beijing (CN)

( * ) Notice: Subject to any disclaimer, the term of this patent is extended or adjusted under 35 U.S.C. 154(b) by 0 days.

(21) Appl. No.: 19/464,248

(22) Filed: Jan. 29, 2026

(65) Prior Publication Data

US 2026/0189241 A1 Jul. 2, 2026

Related U.S. Application Data

(63) Continuation of application No. PCT/CN2025/071450, filed on Jan. 9, 2025.

(30) Foreign Application Priority Data

Dec. 27, 2024 (CN) ......................... 202411942258.3

(51) Int. Cl.
*H03M 1/00* (2006.01)
*H03M 1/10* (2006.01)

(52) U.S. Cl.
CPC ................................. *H03M 1/1009* (2013.01)

(58) Field of Classification Search
CPC ........... H02M 1/0009; H02M 3/33507; H02M 3/33523; H02M 1/08; H02M 3/01;
(Continued)

(56) References Cited

U.S. PATENT DOCUMENTS 3,825,925 A * 7/1974 Drusch .................. H03M 1/00 336/143
4,638,302 A * 1/1987 So .......................... H03M 1/68 341/149

(Continued)

*Primary Examiner* — Linh V Nguyen
(74) *Attorney, Agent, or Firm* — Bochner PLLC; Andrew D. Bochner

(57) ABSTRACT

The present application provides a direct current comparator (DCC) bridge and a current source self-calibration method thereof. The DCC bridge includes structures such as a primary current source, a secondary current source, a primary-loop integer-turn adjustable winding, a primary-loop fractional-turn adjustable winding, an integer-turn switch matrix, a fractional-turn switch matrix, an integer-turn drive module, a fractional-turn drive module, a secondary-loop fixed-turn winding, a differential compensation module, a modulation module, a demodulation module, a regulation module, an analog-to-digital converter (ADC), and a control module. The primary current source and the secondary current source each include a reference digital-to-analog converter (DAC) and a transconductance amplifier. The reference DAC receives a code value from the control module and outputs a voltage corresponding to the code value to the transconductance amplifier. The transconductance amplifier converts a voltage signal output by the reference DAC into a current signal.

12 Claims, 3 Drawing Sheets

(58) Field of Classification Search
CPC .... H02M 3/158; H02M 3/33592; H02M 7/06; H02M 1/0003; H02M 1/0012; H02M 1/0025; H02M 1/007; H02M 1/4208; H02M 1/4225; H02M 3/157; H02M 3/1586; H02M 3/335; H02M 3/33569; H02M 1/0022; H02M 1/0032; H02M 1/0048; H02M 1/0058; H02M 1/0074; H02M 1/008; H02M 1/083; H02M 1/14; H02M 1/15; H02M 1/327; H02M 1/342; H02M 1/42; H02M 1/4241; H02M 1/44; H02M 3/04; H02M 3/08; H02M 3/156; H02M 3/1582; H02M 3/1584; H02M 3/33515; H02M 3/33546; H02M 3/33553; H02M 3/33561; H02M 3/33571; H02M 3/33573; H02M 3/33584; H02M 3/337; H02M 3/3376; H02M 3/3378; H02M 7/12; H02M 7/217; H02M 7/5383; H02M 7/5387; G01R 15/183; G01R 17/105; G01R 27/14; G01R 27/2611; G01R 35/02; G01R 1/071; G01R 15/185; G01R 19/0092; G01R 19/12; G01R 19/16571; G01R 19/2506; G01R 19/2513; G01R 19/32; G01R 27/2605; G01R 31/002; G01R 31/40; G01R 31/72; G01R 35/005; H03F 3/211; H03F 3/2176; H03F 2200/387; H03F 2200/391; H03F 2200/451; H03F 2200/541; H03F 3/19; H03F 3/195; H03F 3/2175; H03F 3/24; H03F 3/245; H03F 3/72; H03F 1/02; H03F 1/0205; H03F 1/0277; H03F 1/083; H03F 1/14; H03F 1/22; H03F 1/26; H03F 1/342; H03F 1/56; H03F 1/565; H03F 2200/114; H03F 2200/153; H03F 2200/171; H03F 2200/222; H03F 2200/294; H03F 2200/378; H03F 2200/39; H03F 2200/432; H03F 2200/459; H03F 2200/516; H03F 2200/534; H03F 2200/537; H03F 2203/21142; H03F 2203/21151; H03F 2203/45438; H03F 2203/45496; H03F 2203/45656; H03F 2203/45731; H03F 3/005; H03F 3/189; H03F 3/193; H03F 3/21; H03F 3/2171; H03F 3/2173; H03F 3/30; H03F 3/45179; H03F 3/45183; H03F 3/45237; H03F 3/45475; H03F 3/50; H03M 1/66; H03M 1/662; H03M 3/458; H03M 1/0626; H03M 1/182; H03M 1/183; H03M 1/38; H03M 1/466; H03M 1/68; H03M 1/70; H03M 1/742; H03M 1/785; H03M 1/80; H03M 1/808; H03M 1/82; H03M 3/424; H03M 3/462
USPC .......................... 341/110, 115, 114, 142, 144
See application file for complete search history.

(56) References Cited

U.S. PATENT DOCUMENTS

| | | | | |
|---|---|---|---|---|
| 5,113,140 | A * | 5/1992 | So | G01R 17/16 324/683 |
| 5,225,784 | A * | 7/1993 | So | H03M 1/80 341/149 |
| 5,602,462 | A * | 2/1997 | Stich | H02J 9/062 307/64 |
| 5,974,339 | A * | 10/1999 | Baker, Jr. | A61N 1/3956 607/7 |
| 6,021,052 | A * | 2/2000 | Unger | H02M 3/33584 363/133 |
| 6,160,851 | A * | 12/2000 | Brown | H04L 25/0286 333/19 |
| 6,208,497 | B1 * | 3/2001 | Seale | H02K 41/03 361/160 |
| 6,494,370 | B1 * | 12/2002 | Sanchez | G01R 31/002 235/455 |
| 6,522,517 | B1 * | 2/2003 | Edel | G01R 15/185 361/146 |
| 6,553,118 | B1 * | 4/2003 | Smith | H04M 1/738 379/390.02 |
| 7,194,037 | B1 * | 3/2007 | Sutardja | H03M 1/0626 375/219 |
| 7,573,412 | B2 * | 8/2009 | Kim | H03M 1/80 341/149 |
| 8,149,064 | B2 * | 4/2012 | Paul | H03F 1/02 330/307 |
| 8,964,418 | B2 * | 2/2015 | Atrash | H02M 3/33507 363/21.07 |
| 9,660,520 | B2 * | 5/2017 | Perreault | H02M 1/4241 |
| 9,995,778 | B1 * | 6/2018 | Fiori, Jr. | G01R 27/2611 |
| 2007/0164682 | A1 * | 7/2007 | Olson | G09G 3/3406 315/149 |
| 2010/0246226 | A1 * | 9/2010 | Ku | H02M 1/4225 363/126 |
| 2013/0335043 | A1 * | 12/2013 | He | H02M 3/08 323/234 |
| 2015/0008899 | A1 * | 1/2015 | Evans | G01R 27/14 324/76.41 |
| 2022/0038079 | A1 * | 2/2022 | Barot | H02M 3/33515 |
| 2022/0196437 | A1 * | 6/2022 | Maharyta | G01R 27/2611 |

* cited by examiner

DIRECT CURRENT COMPARATOR (DCC) BRIDGE AND CURRENT SOURCE SELF-CALIBRATION METHOD THEREOF

CROSS REFERENCE TO RELATED APPLICATION

The present application is a continuation of International Patent Application No. PCT/CN2025/071450, filed on Jan. 9, 2025, which claims priority to the Chinese Patent Application No. 202411942258.3, filed with the China National Intellectual Property Administration on Dec. 27, 2024, and entitled "DIRECT CURRENT COMPARATOR (DCC) BRIDGE AND CURRENT SOURCE SELF-CALIBRATION METHOD THEREOF", which is incorporated herein by reference in its entirety.

TECHNICAL FIELD

The present application relates to the field of measurement apparatuses, and in particular, to a direct current comparator (DCC) bridge and a current source self-calibration method thereof.

BACKGROUND

A direct current comparator (DCC) is a high-accuracy DC comparison apparatus, and is commonly used in a high-accuracy DC measurement instrument. In addition, a DCC bridge for resistance ratio measurement, which uses the DCC as a core in combination with a resistor bridge arm, a current feedback system, and an unbalance voltage detection system, may be further constructed. Depending on different key components and measurement accuracy, the DCC bridge is further divided into a conventional DCC bridge (which is briefly referred to as a DCC bridge) and a low-temperature DCC bridge (which is briefly referred to as a CCC bridge). Measurement accuracy of the DCC bridge is typically in an order of $10^{-7}$ to $10^{-8}$, and measurement accuracy of the CCC bridge is typically in an order of $10^{-9}$ to $10^{-10}$. The DCC bridge has a primary and secondary loop current tracking capability. Therefore, a current ratio value with higher accuracy can be typically obtained through primary and secondary current sources with accuracy in an order of $10^{-4}$ to $10^{-5}$, meeting measurement of a resistance ratio with accuracy in the order of $10^{-7}$ to $10^{-8}$.

However, with the development of science and technology and industry, application fields of the DCC bridge are increasingly expanded. The DCC bridge has been used to measure a load coefficient of a precision resistor because the DCC bridge can simultaneously set a current value and measure a resistance value and can conveniently implement resistance sweep measurement with a current load as an independent variable. In this application scenario, a problem that current accuracy does not match resistance measurement accuracy occurs. To be specific, for two parameters (a current value and a resistance value) used for calculating a load coefficient of a resistor, accuracy of the current value is significantly lower than measurement accuracy of the resistance value. Consequently, accuracy of a finally measurement result is limited by accuracy of a current source.

SUMMARY

To resolve the problem that accuracy of a current value does not match measurement accuracy of a resistance value in an existing DCC bridge, the present application provides a DCC bridge and a current source self-calibration method thereof, to improve accuracy of a current value output by a current source.

To achieve the above objective, the present application provides the following solutions.

In an exemplary embodiment, the present application provides a DCC bridge, including: a primary current source, a secondary current source, a standard resistor terminal, a to-be-tested resistor terminal, an iron core, a primary-loop integer-turn adjustable winding, an integer-turn switch matrix, an integer-turn drive module, a primary-loop fractional-turn adjustable winding, a fractional-turn switch matrix, a fractional-turn drive module, a secondary-loop fixed-turn winding, a differential compensation module, a modulation module, a demodulation module, a regulation module, an ADC, and a control module. The modulation module includes a modulation circuit and a modulation-dedicated winding. The demodulation module includes a demodulation-dedicated winding and a demodulation circuit.

The control module is separately connected to the primary current source, the secondary current source, the integer-turn drive module, the fractional-turn drive module, the differential compensation module, and the ADC.

The primary current source includes a reference DAC and a transconductance amplifier. The reference DAC receives a code value from the control module and outputs a voltage corresponding to the code value to the transconductance amplifier. The transconductance amplifier converts a voltage signal output by the reference DAC into a current signal. A sampling resistor in the transconductance amplifier is switched through a switch to switch a current range. A structure of the secondary current source is the same as a structure of the primary current source.

The standard resistor terminal and the secondary-loop fixed-turn winding are connected in a secondary loop in which the secondary current source is located. The standard resistor terminal is configured to connect an external standard resistor, a standard resistor substitution relay, or a secondary loop standby resistor.

The to-be-tested resistor terminal, the primary-loop integer-turn adjustable winding, the primary-loop fractional-turn adjustable winding, and the differential compensation module are connected in a primary loop in which the primary current source is located. The to-be-tested resistor terminal is configured to connect an external to-be-tested resistor, a to-be-tested resistor substitution relay, or a primary loop standby resistor.

The iron core is configured to wind the primary-loop integer-turn adjustable winding, the primary-loop fractional-turn adjustable winding, the secondary-loop fixed-turn winding, the modulation-dedicated winding, and the demodulation-dedicated winding;

The integer-turn switch matrix is separately connected to the integer-turn drive module and the primary-loop integer-turn adjustable winding. The integer-turn drive module is configured to provide a drive signal for the integer-turn switch matrix under a control instruction of the control module, to connect different turns of windings of the primary-loop integer-turn adjustable winding to the primary loop.

The fractional-turn switch matrix is separately connected to the fractional-turn drive module and the primary-loop fractional-turn adjustable winding. The fractional-turn drive module is configured to provide a drive signal for the fractional-turn switch matrix under a control instruction of the control module, to connect different turns of windings of the primary-loop fractional-turn adjustable winding to the primary loop;

The differential compensation module is configured to extract a primary loop current from the primary loop, and output a primary loop current to the primary-loop fractional-turn adjustable winding after proportional attenuation.

The modulation circuit is connected to the modulation-dedicated winding. The modulation module is configured to modulate a residual magnetic flux in the iron core, and generate a modulated detection signal.

The demodulation circuit is connected to the demodulation-dedicated winding. The demodulation module is configured to demodulate the modulated detection signal into a DC voltage signal.

The regulation module is separately connected to the demodulation circuit and the ADC. The regulation module is configured to filter and amplify the DC voltage signal output by the demodulation module, and output a regulated voltage signal to the ADC.

The ADC is configured to sample the regulated voltage signal and send sampled data to the control module.

The control module is configured to calculate correction values corresponding to the primary current source and the secondary current source based on the sampled data, and correct, based on the correction values, code values received by the primary current source and the secondary current source, to complete self-calibration of the primary current source and the secondary current source.

In an exemplary embodiment, the reference DAC uses a single DAC device.

In an exemplary embodiment, the reference DAC uses a composite DAC including a dual DAC and a proportional adder. The dual DAC includes a first DAC and a second DAC, and the first DAC and the second DAC are respectively denoted as a DACa and a DACb.

In an exemplary embodiment, the present application provides a current source self-calibration method for a DCC bridge. The current source self-calibration method includes:

step 1: switching an integer-turn switch matrix, so that an integer quantity of turns of a primary-loop integer-turn adjustable winding is equal to a fixed quantity of turns of a secondary-loop fixed-turn winding; and switching a fractional-turn switch matrix, so that a fractional quantity of turns of a primary-loop fractional-turn adjustable winding is 0;

step 2: switching a primary current source and a secondary current source to a same current range, short-circuiting a to-be-tested resistor terminal or connecting the to-be-tested resistor terminal to a primary loop standby resistor through a to-be-tested resistor substitution relay, and short-circuiting a standard resistor terminal or connecting the standard resistor terminal to a secondary loop standby resistor through a standard resistor substitution relay;

step 3: denoting a reference DAC of the primary current source as a DAC1 and a reference DAC of the secondary current source as a DAC2, dividing a quantity N of bits of each of the DAC1 and the DAC2 into two parts of high-order bits $N_H$ and low-order bits $N_L$, and initializing values of all the N bits of each of the DAC1 and the DAC2 to 0;

step 4: refreshing output voltages of the DAC1 and the DAC2 based on currently received code values, and respectively outputting, by the primary current source and the secondary current source under driving of the output voltages of the DAC1 and the DAC2, currents to a primary loop and a secondary loop;

step 5: reading sampled data through an ADC, where a reading is denoted as $D_{(i)(j)}$, a subscript i represents a current high-order code value of the DAC1, a subscript j represents a current high-order code value of the DAC2, and $0 \le i, j \le 2^{N_H}-1$;

step 6: if $0 \le j < 2^{N_H}-1$ currently, performing step 7; or if $j = 2^{N_H}-1$ currently, ending this round of cycle and proceeding to step 8;

step 7: if i=j currently, increasing the code value of the DAC1 by 1, that is, i=i+1, and keeping j unchanged; or if i is not equal to j, increasing the code value of the DAC2 by 1, that is, j=j+1, and keeping i unchanged; and proceeding to step 4;

step 8: after this round of cycle ends, collecting a total of $(2\times2^{N_H})$ pieces of sampled data by the ADC, where the $(2\times2^{N_H})$ pieces of sampled data are denoted as $$D_{(0)(0)}, D_{(1)(0)}, D_{(1)(1)}, D_{(2)(1)}, \dots, D_{(2^{N_H}-1)(2^{N_H}-2)}, D_{(2^{N_H}-1)(2^{N_H}-1)};$$

step 9: obtaining first $(2\times2^{N_H}-1)$ pieces of sampled data from the $(2\times2^{N_H})$ pieces of sampled data, grouping the first $(2\times2^{N_H}-1)$ pieces of sampled data sequentially into pairs, and subtracting a former value from a latter value in each group, to calculate a difference $d_{2,k}=D_{(k+1)(k)}-D_{(k)(k)}$ between every two pieces of adjacent sampled data, where a value of k ranges from 0 to $2^{N_H}-2$, k is an integer, and a total of $(2^{N_H}-1)$ $d_{2,k}$ are calculated;

step 10: summing the $(2^{N_H}-1)$ $d_{2,k}$, and performing calculation to obtain $$S_2 = \sum_{k=0}^{2^{N_H}-2} d_{2,k};$$

step 11: calculating a DNL error $e_{2,k}$ between adjacent high-order code values of the DAC2 based on $d_{2,k}$ and $S_2$;

step 12: calculating a correction value $c_{2,k}$ of the DAC2 based on $e_{2,k}$;

step 13: obtaining last $(2\times2^{N_H}-1)$ pieces of sampled data from the $(2\times2^{N_H})$ pieces of sampled data, grouping the last $(2\times2^{N_H}-1)$ pieces of sampled data sequentially into pairs, and subtracting a former value from a latter value in each group, to calculate a difference $d_{1,k}=D_{(k)(k)}-D_{(k)(k-1)}$ between every two pieces of adjacent sampled data, where a value of k ranges from 1 to $2^{N_H}-1$, and a total of $(2^{N_H}-1)$ $d_{1,k}$ are calculated;

step 14: summing the $(2^{N_H}-1)$ $d_{1,k}$, and performing calculation to obtain $$S_1 = \sum_{k=1}^{2^{N_H}-1} d_{1,k};$$

step 15: calculating a DNL error $e_{1,k}$ between adjacent high-order code values of the DAC1 based on $d_{1,k}$ and $S_1$;

step 16: calculating a correction value $c_{1,k}$ of the DAC1 based on $e_{1,k}$; and step 17: when the DCC bridge is in a conventional measurement mode, respectively correcting, by using the correction values $c_{1,k}$ and $c_{2,k}$, code values received by the primary current source and the secondary current source.

In an exemplary embodiment, the calculating a DNL error $e_{2,k}$ between adjacent high-order code values of the DAC2 based on $d_{2,k}$ and $S_2$ in step 11 specifically includes:

$$e_{2,k} = \frac{d_{2,k} \cdot (2^{N_H} - 1) - S_2}{S_2}.$$

In an exemplary embodiment, the calculating a correction value $c_{2,k}$ of the DAC2 based on $e_{2,k}$ in step 12 specifically includes:

$$c_{2,k} = \begin{cases} 0, & k = 0 \text{ or } 2^{N_H} - 2 \\ -2^{N_L} \cdot \sum e_{2,k}, & 0 < k < 2^{N_H} - 2 \end{cases}.$$

In an exemplary embodiment, the calculating a DNL error $e_{1,k}$ between adjacent high-order code values of the DAC1 based on $d_{1,k}$ and $S_1$ in step 15 specifically includes:

$$e_{1,k} = \frac{d_{1,k} \cdot (2^{N_H} - 1) - S_1}{S_1}.$$

In an exemplary embodiment, the calculating a correction value $c_{1,k}$ of the DAC1 based on $e_{1,k}$ in step 16 specifically includes:

$$c_{1,k} = \begin{cases} 0, & k = 1 \text{ or } 2^{N_H} - 1 \\ -2^{N_L} \cdot \sum e_{1,k}, & 1 < k < 2^{N_H} - 1 \end{cases}.$$

In an exemplary embodiment, the dividing a quantity N of bits of each of the DAC1 and the DAC2 into two parts of high-order bits $N_H$ and low-order bits $N_L$ in step 3 specifically includes:

when the reference DAC uses a single DAC device, determining the low-order bits $N_L$ of the quantity N of bits according to a formula $2^{N_L-1}<\text{INL}<2^{N_L}$, and the rest of the quantity N of bits as the high-order bits $N_H$, where INL is a maximum integral non-linearity error of the reference DAC.

In an exemplary embodiment, the dividing a quantity N of bits of each of the DAC1 and the DAC2 into two parts of high-order bits $N_H$ and low-order bits $N_L$ in step 3 specifically includes:

when the reference DAC uses a composite DAC including a dual DAC and a proportional adder, if a resistance ratio of the proportional adder is $\frac{1}{2^m}$, using an effective quantity of bits of a DACa as the high-order bits $N_H$, and using m as the low-order bits $N_L$, to form the reference DAC with total bits $N=N_H+N_L$.

According to specific examples provided in the present application, the present application discloses the following technical effects:

According to the DCC bridge and the current source self-calibration method thereof provided in the present application, through the control module built in the DCC bridge, correction values corresponding to the primary current source and the secondary current source are calculated based on sampled data of the ADC, and outputs of the current sources in a conventional measurement mode are corrected by using the correction values. This can reduce an overall non-linearity error between the outputs of the current sources to within 1 least significant bit (LSB), to significantly improve accuracy of current values output by the current sources.

BRIEF DESCRIPTION OF THE DRAWINGS

To describe the technical solutions in the embodiments of the present application more clearly, the drawings required for describing the embodiments are briefly described below. Apparently, the drawings in the following description show merely some embodiments of the present application, and a person of ordinary skill in the art may still derive other drawings from these drawings without creative efforts.

DETAILED DESCRIPTION OF THE EMBODIMENTS

The technical solutions in the embodiments of the present application are clearly and completely described below with reference to the drawings in the embodiments of the present application. Apparently, the described embodiments are only some rather than all of the embodiments of the present application. All other embodiments obtained by a person of ordinary skill in the art based on the embodiments of the utility model without creative efforts shall fall within the protection scope of the present application.

To improve accuracy of a current source in a DCC bridge, the present application provides a DCC bridge and a current source self-calibration method. The method is implemented through a control module built in the DCC bridge, and an output of the current source in a conventional measurement mode is corrected by using self-calibration data (a correction value), to improve accuracy of a current parameter of the DCC bridge.

To make the above objectives, features, and advantages of the present application more obvious and easy to understand, the present application will be further described in detail with reference to the accompanying drawings and specific implementations.

Figure 1:
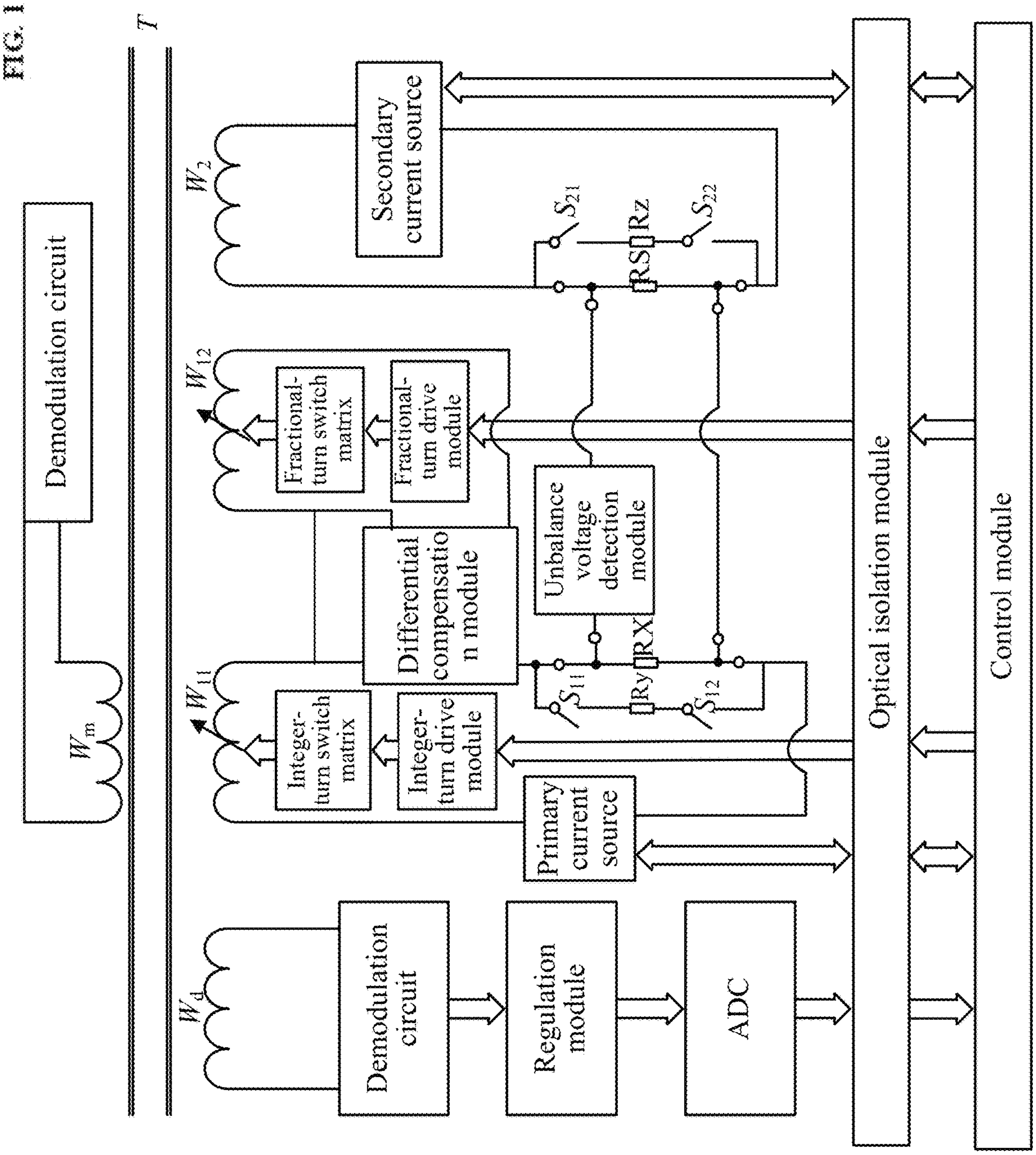
FIG. 1 is a schematic structural diagram of a basic composition of a DCC bridge.

As shown in FIG. 1, in an exemplary embodiment, the present application provides a DCC bridge (which is briefly referred to as a bridge below), including: a primary current source, a secondary current source, a standard resistor terminal, a to-be-tested resistor terminal, an iron core T, a primary-loop integer-turn adjustable winding $W_{11}$, an integer-turn switch matrix, an integer-turn drive module, a primary-loop fractional-turn adjustable winding $W_{12}$, a fractional-turn switch matrix, a fractional-turn drive module, a secondary-loop fixed-turn winding $W_2$, a differential compensation module, a modulation module, a demodulation module, a regulation module, an ADC, and a control module. The modulation module includes a modulation circuit and a modulation-dedicated winding $W_m$. The demodulation module includes a demodulation-dedicated winding $W_d$ and a demodulation circuit. In another embodiment, the DCC bridge may further include an unbalance voltage detection module and/or an optical isolation module.

The control module is separately connected to the primary current source, the secondary current source, the integer-turn drive module, the fractional-turn drive module, the differential compensation module, and the ADC. In another embodiment, the control module is further separately connected to the unbalance voltage detection module and/or the optical isolation module.

Figure 2:
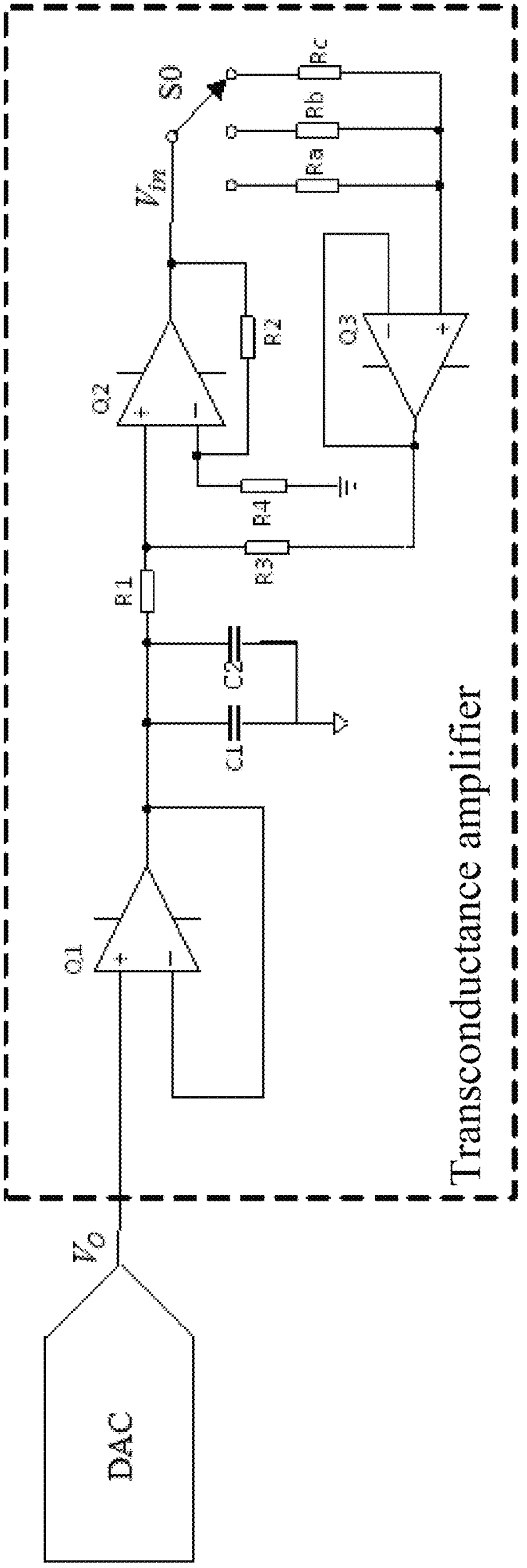
FIG. 2 is a schematic structural diagram of a current source of which a reference DAC uses a single DAC device.
Figure 3:
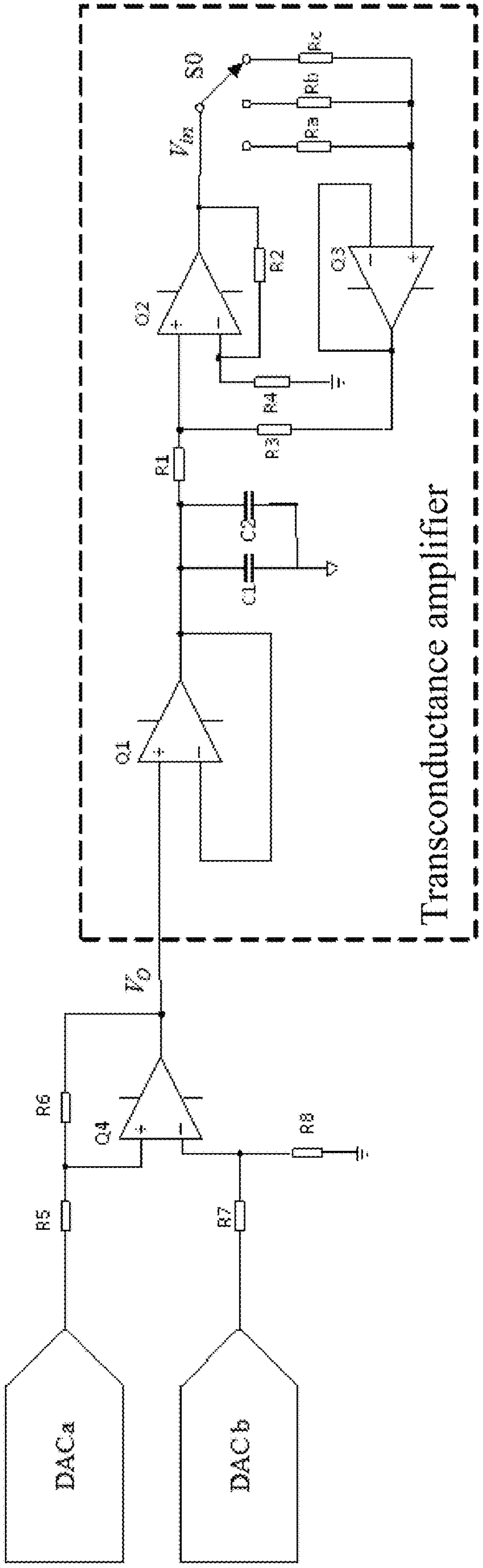
FIG. 3 is a schematic structural diagram of a current source of which a reference DAC uses a composite DAC.

As shown in FIG. 2 and FIG. 3, the primary current source mainly includes a reference digital-to-analog converter (DAC) and a transconductance amplifier. In the present application, the reference DAC may use a single DAC device shown in FIG. 2, or may use a composite DAC including a dual DAC and a proportional adder shown in FIG. 3. The dual DAC includes a first DAC and a second DAC, and the first DAC and the second DAC are respectively denoted as a DACa and a DACb. The reference DAC receives a control instruction and a code value from the control module and outputs a voltage $V_O$ corresponding to the code value to the transconductance amplifier. The transconductance amplifier converts a voltage signal output by the reference DAC into a current signal. A sampling resistor in the transconductance amplifier is switched through a switch to switch a current range. A structure of the secondary current source is the same as a structure of the primary current source.

In exemplary embodiments shown in FIG. 2 and FIG. 3, an input end of the transconductance amplifier uses an operational amplifier Q1 to form a buffer circuit, to implement impedance matching between a front-stage circuit and a rear-stage circuit. Capacitors C1 and C2 are connected in parallel from a rear stage of the buffer circuit to ground, to filter a front-stage signal and reduce noise. Operational amplifiers Q2 and Q3, sampling resistors Ra, Rb, and Rc, and resistors R1, R2, R3, and R4 that have equal resistance values jointly form a Howland current source circuit, to convert an output voltage of the buffer circuit into a current for output. An output point of the current is a common connection point of the sampling resistors Ra, Rb, and Rc.

Sampling resistors in the transconductance amplifier are Ra, Rb, and Rc. A multiplexer switch S0 is controlled, so that only one sampling resistor of Ra, Rb, or Rc is connected to the circuit at any time. Because a magnitude of the output current is equal to $V_{in}/R$, where $V_{in}$ is a voltage at an input end of the sampling resistor, and R is a resistance value of the sampling resistor of Ra, Rb, or Rc connected to the circuit, a resistance value is selected by Ra, Rb, or Rc in a decimal manner, so that the current range can be switched by switching the sampling resistor. Certainly, in actual application, the transconductance amplifier is not limited to this circuit form. A function of the transconductance amplifier can also be implemented in another circuit form. The range selection is not limited to three ranges and may be designed based on a requirement The control module may send a control instruction to the DAC for configuring a parameter of a DAC device. For example, an output range, a polarity, and the like of the DAC device may be configured. When the parameter of the DAC is configured in advance, the control module sends a code value to the DAC. The DAC may convert, based on the configured parameter and an output feature (a conversion formula specified in the device), the code value into a voltage for output In a circuit structure of the composite DAC shown in FIG. 3, the proportional adder includes an operational amplifier Q4 and four high-precision resistors R5, R6, R7, and R8. Components in the circuit structure of the composite DAC have the following relationship:

$$V_0 = \frac{V_b\frac{R_8}{R_7+R_8} - V_a}{R_5}(R_5+R_6) + V_a = \frac{-(R_5+R_6)V_a + R_5V_a + V_b\frac{R_8}{R_7+R_8}(R_5+R_6)}{R_5}.$$

If R5=R8 and R6=R7 are set.

$$V_0 = \frac{-(R_5+R_6)V_a + R_5V_a + V_b\frac{R_5}{R_6+R_5}(R_5+R_6)}{R_5} = \frac{-R_6V_a + R_5V_b}{R_5} = V_b - \frac{R_6}{R_5}V_a.$$

R5, R6, R7, and R8 are respectively resistance values of the four high-precision resistors R5, R6, R7, and R8. $V_O$ is a voltage output by the reference DAC. $V_a$ and $V_b$ are respectively output amplitude voltages of the DACa and the DACb.

In a resistance value configuration, if a resistance value ratio $$\frac{R_6}{R_5} = \frac{1}{M} << 1,\ V_O = V_b - \frac{1}{M}V_a,$$

where M is a positive integer.

Generally, DAC devices of same specifications may be selected for the DACa and the DACb, and the DACa and the DACb have a same output range and resolution. Then, a total output voltage of the dual DAC obtained through combination of the proportional adder is $V_O$, and is equivalent to a combination of an output amplitude voltage of the DACa obtained through attenuation by M times and an output amplitude voltage of the DACb. It is equivalent to a case in which the DACa provides high-order bits $N_H$ of a total output voltage signal, and the DACb provides low-order bits $N_L$ of the total output voltage signal In comparison of an output of the single DAC, the composite DAC increases an adjustable resolution by M times. M is converted into binary and is represented as $2^m$, where m is also a positive integer.

The structure of the secondary current source is the same as the structure of the primary current source. In the present application, both the primary current source and the secondary current source are to-be-calibrated objects.

As shown in FIG. 1, when the DCC bridge is in a conventional measurement mode, the standard resistor terminal is configured to connect an external standard resistor $R_s$. In other words, the standard resistor terminal is represented by using four circles at two ends of $R_s$ in FIG. 1. Whether the standard resistor terminal is connected to $R_s$ does not affect the current source self-calibration method of the present application. In other words, a self-calibration process can be completed when the standard resistor terminal is suspended.

As shown in FIG. 1, the standard resistor terminal and the secondary-loop fixed-turn winding $W_2$ are connected in a secondary loop in which the secondary current source is located. When current source self-calibration is performed, the standard resistor terminal is configured to connect a standard resistor substitution relay or a secondary loop standby resistor $R_z$.

When the DCC bridge is in the conventional measurement mode, the to-be-tested resistor terminal is configured to connect an external to-be-tested resistor $R_x$. In other words, the to-be-tested resistor terminal is represented by using four circles at two ends of $R_x$ in FIG. 1. Whether the to-be-tested resistor terminal is connected to $R_x$ does not affect the current source self-calibration method of the present application. In other words, a self-calibration process can be completed when the to-be-tested resistor terminal is suspended.

As shown in FIG. 1, the to-be-tested resistor terminal, the primary-loop integer-turn adjustable winding $W_{11}$, the primary-loop fractional-turn adjustable winding $W_{12}$, and the differential compensation module are all connected in a primary loop in which the primary current source is located. When current source self-calibration is performed, the to-be-tested resistor terminal is configured to connect a to-be-tested resistor substitution relay or a primary loop standby resistor $R_y$.

A standby resistor is a resistor that is connected to the standard resistor $R_s$ or the to-be-tested resistor $R_x$ in parallel through a relay in the bridge. In this embodiment of the present application, standby resistors respectively correspond to the secondary loop standby resistor $R_z$ and the primary loop standby resistor $R_y$. This can avoid current source open-circuit faults in the primary loop and the secondary loop when no external resistor is connected. When current source self-calibration is performed, both the primary loop and the secondary loop may be switched to the standby resistors, so that the bridge does not need to be externally connected to the standard resistor $R_s$ and the to-be-tested resistor $R_x$. According to the circuit theory, the current source cannot be open-circuited. When there is no standby resistor, the standard resistor or the to-be-tested resistor is not connected, and the current source is open-circuited, to damage the circuit. When there is a standby resistor, it can be ensured that when the standard resistor or the to-be-tested resistor is not connected, the primary loop or the secondary loop may be switched to the standby resistor, to ensure that the current source is not open-circuited. It should be noted that a DCC typically has a standby resistor to implement the operation. If there is no standby resistor, relays may be arranged at two ends of a bridge arm resistor (namely, the standard resistor $R_s$ or the to-be-tested resistor $R_x$) and the relays are controlled to short-circuit the bridge arm resistor. In this embodiment of the present application, the relays are referred to as the standard resistor substitution relay and the to-be-tested resistor substitution relay. Specifically, the control module sends a control signal, so that a moving contact of the relay may be switched from a connection line of $R_s$ or $R_x$ to a connection line of $R_z$ or $R_y$. For example, moving contacts $S_{11}$ and $S_{12}$ of a relay are closed, and to-be-tested resistor terminals at two ends of $R_x$ are disconnected, so that the primary loop may be switched to the connection line of $R_y$. Moving contacts $S_{21}$ and $S_{22}$ of a relay are closed, and standard resistor terminal at two ends of $R_s$ are disconnected, so that the secondary loop may be switched to the connection line of $R_z$. If there is no standby resistor, the moving contact of the relay is correspondingly switched from the connection line of $R_s$ or $R_x$ to a connection line of the standard resistor substitution relay or the to-be-tested resistor substitution relay.

The iron core Tis configured to wind the primary-loop integer-turn adjustable winding $W_{11}$, the primary-loop fractional-turn adjustable winding $W_{12}$, the secondary-loop fixed-turn winding $W_2$, the modulation-dedicated winding $W_m$, and the demodulation-dedicated winding $W_d$. In this embodiment of the present application, a loop through which an output current of the primary current source flows is referred to as the primary loop. The primary loop includes the primary current source, the to-be-tested resistor $R_x$, the primary-loop integer-turn adjustable winding $W_{11}$, the differential compensation module, the primary-loop fractional-turn adjustable winding $W_{12}$, and the like. A loop through which an output current of the secondary current source flows is referred to as the secondary loop. The secondary loop includes the secondary current source, the secondary-loop fixed-turn winding $W_2$, the standard resistor $R_s$, and the like.

The primary-loop integer-turn adjustable winding $W_{11}$ is an integer-turn winding that is connected in series in the primary loop and of which a quantity of turns is adjustable. A function of the primary-loop integer-turn adjustable winding is to adjust, by changing an integer quantity of turns, a magnetic flux generated by a primary loop current in the iron core T. The primary-loop fractional-turn adjustable winding $W_{12}$ is a winding that is connected in series in an output loop of the differential compensation module and of which a quantity of turns is adjustable. A function of the primary-loop fractional-turn adjustable winding is to adjust, by changing a fractional quantity of turns, a magnetic flux generated by a primary loop current in the iron core T. The fixed-turn winding $W_2$ is a winding that is connected in series in the secondary loop and that has a fixed quantity of turns. A function of the fixed-turn winding is to cause a secondary loop current to generate a magnetic flux in the iron core T. A function of the modulation-dedicated winding $W_m$ is to generate a modulated magnetic flux signal in the iron core T. The magnetic fluxes generated in the iron core T by the currents of the windings $W_{11}$, $W_{12}$, and $W_2$ of the primary loop and the secondary loop cancel each other, a residual magnetic flux is modulated through the modulation-dedicated winding $W_m$, an induced electromotive force is induced in the demodulation-dedicated winding $W_d$, a voltage signal proportional to the residual magnetic flux is restored through the demodulation circuit, the voltage signal is matched to an input range of the ADC through the regulation module, and finally the ADC collects the signal and digitizes the signal, and sends the signal to the control module as sampled data.

The primary-loop integer-turn adjustable winding $W_{11}$ needs a switch matrix to determine whether different turns of windings are connected into the primary loop. The switch matrix typically includes a plurality of relays, and a drive module provides a drive signal for the switch matrix. A switch matrix and a drive module of the switch matrix arranged for the primary-loop integer-turn adjustable winding $W_{11}$ are respectively referred to as an integer-turn switch matrix and an integer-turn drive module. As shown in FIG. 1, the integer-turn switch matrix is separately connected to the integer-turn drive module and the primary-loop integer-turn adjustable winding $W_{11}$. The integer-turn drive module is configured to provide a drive signal for the integer-turn switch matrix under a control instruction of the control module, to connect different turns of windings of the primary-loop integer-turn adjustable winding $W_{11}$ to the primary loop.

Similarly, the primary-loop fractional-turn adjustable winding $W_{12}$ also needs a switch matrix to determine whether different turns of windings are connected into the primary loop. The switch matrix typically includes a plurality of relays, and a drive module provides a drive signal for the switch matrix. A switch matrix and a drive module of the switch matrix arranged for the primary-loop fractional-turn adjustable winding $W_{12}$ are respectively referred to as a fractional-turn switch matrix and a fractional-turn drive module. As shown in FIG. 1, the fractional-turn switch matrix is separately connected to the fractional-turn drive module and the primary-loop fractional-turn adjustable winding $W_{12}$. The fractional-turn drive module is configured to provide a drive signal for the fractional-turn switch matrix under a control instruction of the control module, to connect different turns of windings of the primary-loop fractional-turn adjustable winding $W_{12}$ to the primary loop.

The differential compensation module is configured to extract a primary loop current from the primary loop, and output a primary loop current to the primary-loop fractional-turn adjustable winding $W_{12}$ after proportional attenuation. The differential compensation module may be generally classified into a passive compensator form and an active compensator form.

In the modulation module, the modulation circuit is connected to the modulation-dedicated winding $W_m$. The modulation module is configured to modulate a residual magnetic flux inside the DCC bridge, that is, inside the iron core T, and generate a modulated detection signal.

In the demodulation module, the demodulation circuit is connected to the demodulation-dedicated winding $W_d$. The demodulation module is configured to demodulate the modulated detection signal of the DCC bridge into a DC voltage signal.

The regulation module is separately connected to the demodulation circuit and the ADC. The regulation module is configured to filter and amplify the DC voltage signal output by the demodulation module, and output a regulated voltage signal to the ADC.

The analog-to-digital converter (ADC) is configured to sample the regulated voltage signal and send sampled data to the control module. In the conventional measurement mode of the DCC bridge, the sampled data is used for feedback control to achieve tracking of the primary loop current by the secondary loop. When current source self-calibration is performed, the control module is configured to calculate correction values corresponding to the primary current source and the secondary current source based on the sampled data, and correct, based on the correction values, code values received by the primary current source and the secondary current source, to complete a self-calibration process of the primary current source and the secondary current source.

The control module is generally an embedded processor, for example, an ARM or an FPGA. In the conventional measurement mode, the control module generates and sends control instructions for current setting, feedback, switch switching, and the like. When current source self-calibration is performed, a self-calibration procedure and a correction algorithm are stored in the control module. After a user enables a corresponding function, the calibration procedure is automatically completed, calibration data is stored, and automatic current correction is implemented after a self-calibration mode is exited.

Because an upper part and a lower part of the bridge shown in FIG. 1 use different power supply systems, the optical isolation module is arranged to isolate the control module from all the analog circuits through optical signals, to reduce interference from the control module to the analog circuits.

The unbalance voltage detection module has two input ends, which are respectively connected to high-voltage ends of the to-be-tested resistor $R_x$ and the standard resistor $R_s$. A function of the unbalance voltage detection module is to detect an unbalance voltage between the to-be-tested resistor $R_x$ and the standard resistor $R_s$.

To describe implementation solutions of the present application more clearly, the basic composition of the DCC bridge has been described above. Most modules of the DCC bridge, for example, the differential compensation module, the switch matrices, the drive modules, the modulation module, the demodulation module, and the regulation module, may be implemented using different technical routes in a specific system. These are not key points protected by the present application. However, regardless of a solution used to implement the modules, basic functions of the modules may meet implementation of a current source self-calibration method in the present application, and finally, accuracy of a current output is improved in an original system.

Based on the system structure of the DCC bridge shown in FIG. 1, the present application further provides a current source self-calibration method, including the following step 1 to step 17.

In step 1, an integer-turn switch matrix is switched, so that an integer quantity of turns of a primary-loop integer-turn adjustable winding $W_{11}$ is equal to a fixed quantity of turns of a secondary-loop fixed-turn winding $W_2$; and a fractional-turn switch matrix is switched, so that a fractional quantity of turns of a primary-loop fractional-turn adjustable winding $W_{12}$ is 0.

Specifically, a control module sends a control instruction to switch the integer-turn switch matrix of the primary-loop integer-turn adjustable winding $W_{11}$, so that the integer quantity of turns is equal to the fixed quantity of turns of the secondary-loop fixed-turn winding $W_2$. In addition, the fractional-turn switch matrix of the primary-loop fractional-turn adjustable winding $W_{12}$ is switched, so that the fractional quantity of turns of a primary loop is 0. A ratio error of a quantity of turns of a winding is far less than a to-be-calibrated current error. In this case, a primary current source and a secondary current source respectively induce magnetic fluxes in an iron core T through the windings and cancel the magnetic fluxes each other. A residual magnetic flux is reflected as an output voltage through the modulation module and the demodulation module.

In step 2, a primary current source and a secondary current source are switched to a same current range, short-circuit a to-be-tested resistor terminal is short-circuited or connected to a primary loop standby resistor $R_y$ through a to-be-tested resistor substitution relay, and a standard resistor terminal is short-circuited or connected to a secondary loop standby resistor $R_z$ through a standard resistor substitution relay.

It should be noted that because a transconductance amplifier may have different nonlinear features under different ranges, to obtain calibration data with higher accuracy, a current source self-calibration procedure needs to be performed under each range. In this embodiment, one range is selected for describing a specific self-calibration method.

Current ends of a bridge arm resistor (where both the standard resistor $R_s$ and the to-be-tested resistor $R_x$ belong to the bridge arm resistor) in a primary loop and a secondary loop are shorted circuited or connected to an internal standby resistor. It should be noted that a DCC typically has a standby resistor to implement the operation. If there is no standby resistor, relays may be arranged at two ends of the bridge arm resistor (namely, the standard resistor $R_s$ or the to-be-tested resistor $R_x$), and the relays are controlled to short-circuit the bridge arm resistor. In the present application, an unbalance voltage detection module is not used in the method. To avoid saturation of the unbalance voltage detection module caused by an unbalance voltage generated during self-calibration, the unbalance voltage detection module is controlled to be disconnected from the bridge circuit.

In step 3, a reference DAC of the primary current source is denoted as a DAC1 and a reference DAC of the secondary current source is denoted as a DAC2, a quantity N of bits of each of the DAC1 and the DAC2 is divided into two parts of high-order bits $N_H$ and low-order bits $N_L$, and values of all the N bits of each of the DAC1 and the DAC2 are initialized to 0.

Division of the quantity N of bits of the reference DAC has the following two solutions.

Solution 1: When the reference DAC uses the single DAC device shown in FIG. 2, the low-order bits $N_L$ of the quantity N of bits are determined according to a formula $2^{N_L-1}<INL<2^{N_L}$, and the rest of the quantity N of bits are the high-order bits $N_H$. INL is a maximum integral non-linearity error of the reference DAC In other words, assuming that the maximum integral non-linearity error is INL, a smallest quantity of bits greater than the maximum integral non-linearity error INL is used as $N_L$, and the rest are $N_H$.

Solution 2: When the reference DAC uses a composite DAC including a dual DAC and a proportional adder, as shown in FIG. 3, output voltages of two DACs (a DACa and a DACb) are combined by using an adder of a 1/M resistance ratio, and a resistance ratio of the proportional adder is set to $M=\frac{1}{2}^m$, an effective quantity of bits of the DACa is used as high-order bits $N_H$, and m is used as low-order bits $N_L$, to form the composite DAC with total bits $N=N_H+N_L$ as the reference DAC.

In this embodiment of the present application, a 16-bit single DAC device is used for description, that is, N=16 is divided into two parts of high-order bits $N_H=14$ and lower-order bits $N_L=2$. The quantity N of bits is a quantity of binary bits of the DAC. The quantity of bits is a basic parameter of the DAC. A high-order bit is a bit with a larger weight, and a low-order bit is a bit with a smaller weight. For example, a decimal number 1234 has four bits, a thousands place and a hundreds place may be considered high-order bits, while a tens place and a ones places are low-order bits. Binary is similar. A code value is a value represented by using binary code. In Solution 2, the DACa and the DACb jointly form a composite DAC, a high-order bit and a lower-order bit are a high-order bit and a lower-order bit of the composite DAC.

In step 4, output voltages of the DAC1 and the DAC2 are refreshed based on currently received code values, and the primary current source and the secondary current source respectively output currents to a primary loop and a secondary loop under driving of the output voltages of the DAC1 and the DAC2.

A full name of the DAC is a digital-to-analog converter. Digital is a value represented by a binary code, and analog means that a voltage is an analog signal. A basic mode of the DAC is that a group of binary codes (referred to as a code value in the present application) is input, and the DAC outputs a corresponding voltage. Each time the control module inputs a code value, an output of the DAC changes accordingly. Refresh is a method for this change.

In step 5, sampled data is read through an ADC, where a reading is denoted as $D_{(i)(j)}$, a subscript i represents a current high-order code value of the DAC1, a subscript j represents a current high-order code value of the DAC2, and $0 \le i, j \le 2^{N_H}-1$.

In this embodiment of the present application, the subscript i represents a current high 14-bit code value of the DAC1, the subscript j represents a current high 14-bit code value of the DAC2, and $0 \le i,j \le 2^{14}-1$.

In step 6, if $0 \le j < 2^{N_H}-1$ currently, step 7 is performed; or if $j=2^{N_H}-1$ currently, this round of cycle ends and step 8 is performed.

In this embodiment of the present application, $2^{14}-1=16383$. If $0 \le j < 16383$ currently, step 7 is performed. If j=16383 currently, a next step is performed, and this round of cycle is ended.

In step 7, if i=j currently, a code value of the DAC1 is increased by 1, that is, i=i+1, and j is kept unchanged; or if i is not equal to j, a code value of the DAC2 is increased by 1, that is, j=j+1, and i is kept unchanged; and step 4 is performed.

The code values of the DAC1 and the DAC2 are changed in the cyclic process, that is, the code value of the DAC1 is increased by 1 or the code value of the DAC2 is increased by 1.

In step 8, after this round of cycle ends, the ADC collects a total of $(2\times2^{N_H})$ pieces of sampled data, where the $(2\times2^{N_H})$ pieces of sampled data are denoted as $$D_{(0)(0)}, D_{(1)(0)}, D_{(1)(1)}, D_{(2)(1)}, \dots , D_{(2^{N_{H-1}})(2^{N_{H-2}})}, D_{(2^{N_{H-1}})(2^{N_{H-1}})}.$$

In the cyclic process, i and j alternately change. When this round of cycle ends, that is, an end condition of step 6 is met, $2\times2^{N_H}$ values are collected.

In step 9, first $(2\times2^{N_H}-1)$ pieces of sampled data are obtained from the $(2\times2^{N_H})$ pieces of sampled data, the first $(2\times2^{N_H}-1)$ pieces of sampled data are grouped sequentially into pairs, and a former value is subtracted from a latter value in each group, to calculate a difference $d_{2,k}=D_{(k+1)(k)}-D_{(k)(k)}$ between every two pieces of adjacent sampled data, where a value of k ranges from 0 to $2^{N_H}-2$, k is an integer, and a total of $(2^{N_H}-1)$ $d_{2,k}$ are calculated.

In a same formula, values of k are the same. k is a subscript sequence number, and is used to represent the sampled data obtained in step 8 in a uniform form. For example, when k=0, it is equivalent to $d_{2,0}=D_{(1)(0)}-D_{(0)(0)}$. In this embodiment of the present application, the value of k ranges from 0 to 16382 in step 9, and a total of 16383 $d_{2,k}$ are calculated.

In step 10, the $(2^{N_H}-1)$ $d_{2,k}$ are summed, and calculation is performed to obtain $$S_2 = \sum_{k=0}^{2^{N_H-2}} d_{2,k}.$$

In step 11, a DNL error $e_{2,k}$ between adjacent high-order code values of the DAC2 is calculated based on $d_{2,k}$ and $S_2$. Specifically, $$e_{2,k} = \frac{d_{2,k}\cdot(2^N H - 1) - S_2}{S_2}.$$

In this embodiment of the present application, the value of k ranges from 0 to 16382 in step 11, and a total of 16383 $e_{2,k}$ are calculated. $e_{2,k}$ is the DNL error between adjacent code values represented by high 14 bits of the DAC2. The DNL error value $e_{2,k}$ is obtained through self-calibration, that is, the DNL error of the DAC2 can be corrected by setting a low $N_L$=2 bit value during conventional measurement, to obtain a more accurate current output.

A full name of a DNL (differential non-linearity) error is a differential non-linearity error. Because the high 14 bits are used in the self-calibration process, the error value is represented by using the high 14 bits. A unit of a least significant bit in the high 14 bits is equal to four times a unit of low 2 bits (a factor of $2^2$). In other words, a voltage represented by the low 2 bits is more detailed than that represented by the high 14 bits. If the error value represented by the high 14 bits has a decimal part, the error value may be compensated by using the lower 2 bits in a more detailed manner.

In step 12, a correction value $c_{2,k}$ of the DAC2 is calculated based on $e_{2,k}$. Specifically, $$c_{2,k} = \begin{cases} 0, k = 0 \text{ or } 2^{N_H} - 2 \\ -2^{N_L} \cdot \sum e_{2,k}, 0 < k < 2^{N_H} - 2 \end{cases}.$$

In step 13, last $(2\times2^{N_H}-1)$ pieces of sampled data are obtained from the $(2\times2^{N_H})$ pieces of sampled data, the last $(2\times2^{N_H}-1)$ pieces of sampled data are grouped sequentially into pairs, and a former value is subtracted from a latter value in each group, to calculate a difference $d_{1,k}=D_{(k)(k)}-D_{(k)(k-1)}$ between every two pieces of adjacent sampled data, where a value of k ranges from 1 to $2^{N_H}-1$, and a total of $(2^{N_H}-1)$ $d_{1,k}$ are calculated.

In this embodiment of the present application, the value of k ranges from 1 to 16383 in step 13, and a total of 16383 $d_{1,k}$ are calculated.

In step 14, the $(2^{N_H}-1)$ $d_{1,k}$ are summed, and calculation is performed to obtain $$S_1 = \sum_{k=1}^{2^{N_H-1}} d_{1,k}.$$

In step 15, a DNL error $e_{1,k}$ between adjacent high-order code values of the DAC1 is calculated based on $d_{1,k}$ and $S_1$. Specifically, $$e_{1,k} = \frac{d_{1,k} \cdot (2^N H - 1) - S_1}{S_1}.$$

In this embodiment of the present application, the value of k ranges from 1 to 16383 in step 14, and a total of 16383 $e_{1,k}$ are calculated. $e_{1,k}$ is the DNL error between adjacent code values represented by high 14 bits of the DAC1. The meaning is the same as the foregoing.

In step 16, a correction value $c_{1,k}$ of the DAC2 is calculated based on $e_{1,k}$. Specifically, $$c_{1,k} = \begin{cases} 0, k = 1 \text{ or } 2^{N_H} - 1 \\ -2^{N_L} \cdot \sum e_{1,k}, 1 < k < 2^{N_H} - 1 \end{cases}.$$

The correction values $c_{1,k}$ and $c_{2,k}$ obtained through self-calibration are stored in the control module for use in the conventional measurement mode.

In step 17, when the DCC bridge is in a conventional measurement mode, code values received by the primary current source and the secondary current source are respectively corrected by using the correction values $c_{1,k}$ and $c_{2,k}$.

When the DCC bridge is in the conventional measurement mode, after a user sets a test current by using the control module, the current value is converted by the control module into a corresponding DAC set code value. Assuming that a set code value of a corresponding DAC (for example, the DAC1) of a current source is set by the user to D1, the code value is corrected in the following step 17.1 to step 17.5, and then output to the reference DAC. In the correction process described in the following, the subscript k of the correction values $c_{1,k}$ and $c_{2,k}$ is specifically replaced with values such as D1H and D1L for representation.

In step 17.1, D1 is divided into 14 bits and 2 bits by binary, where a high 14-bit code value is denoted as D1H, and a low 2-bit code value is denoted as D1L.

In step 17.2, $c_{1,D1H}$ is queried in $c_{1,k}$, and $h=c_{1,D1H}+D1L$ is calculated. h is a variable set for simplifying an expression.

In step 17.3, if $0\leq h<2^{N_L}-1$, step 17.4 is performed;

if h<0, D1H=D1H−1, $D1L=D1L+2^{N_L}$, and step 17.2 is performed; or if $h\geq2^{N_L}-1$, D1H=D1H+1, $D1L=D1L-2^{N_L}$, and step 17.2 is performed.

In step 17.4, D1L=h is obtained, and a complete corrected code value D11 is formed with the current D1H, that is, $D11=h+2^{N_L}\cdot D1H$.

In step 17.5, the control module sets a code value of the DAC1 to D11 and outputs D11, for controlling an output voltage of the DAC1.

When the reference DAC of the current source is a single DAC device, a 16-bit DAC device is used, and the technical manual gives an integral non-linearity error less than ±2 LSB. It should be noted that the overall non-linearity error output by the current source further includes a non-linearity error introduced by a back-stage transconductance amplifier. In this embodiment, this part i is less than ±1 LSB when being referred to a DAC output. Therefore, an overall maximum integral non-linearity error of the current source is ±3 LSB. According to the foregoing method, in the present application, a non-linearity error of an overall output of the current source may be reduced to less than 1 LSB. When the reference DAC of the current source is a composite DAC, a resolution of the DAC is improved, and more accurate data can be obtained in a self-calibration procedure.

According to the method in the foregoing embodiments, the error of the current source in Solution 1 may be reduced by several times. If higher accuracy is desired, Solution 2 may be used. In Solution 2, the DAC in the current source is formed by combining the DACa and the DACb by using the proportional adder. In this embodiment, a 14-bit DAC component of a same model is selected for the DACa and the DACb, and a non-linearity error is less than 1 LSB. By setting a resistance ratio $M=½^m$ of the proportional adder, so that output voltages of the DACa and the DACb are added and output in a ratio of $½^6=1/64$, then $N_H=14$, $N_L=m=6$, and total significant bits N of the composite DAC are equal to 20 bits. It should be noted that in Solution 2, only high 6 bits of the DACb are used, and unused lower 8 bits are set to 0. A subsequent self-calibration procedure and a correction procedure are the same as those in Solution 1. Details are not described again. In a manner of Solution 2, the non-linearity error of the overall output of the current source may be reduced by tens of times, that is, 1 to 2 orders of magnitude. Solution 2 improves an effective resolution of the DAC.

During error measurement and correction, an operation can be performed with a resolution less than 1 LSB, so that an effect of error correction can be improved.

Several examples are used herein for illustration of the principles and implementations of the present application. The description of the foregoing examples is used to help illustrate the method of the present application and the core principles thereof. In addition, those of ordinary skill in the art can make various modifications in terms of specific implementations and scope of application in accordance with the teachings of the present application. In conclusion, the content of the present specification shall not be construed as a limitation to the present application.

What is claimed is:

1. A direct current comparator (DCC) bridge, comprising: a primary current source, a secondary current source, a standard resistor terminal, a to-be-tested resistor terminal, an iron core, a primary-loop integer-turn adjustable winding, an integer-turn switch matrix, an integer-turn drive module, a primary-loop fractional-turn adjustable winding, a fractional-turn switch matrix, a fractional-turn drive module, a secondary-loop fixed-turn winding, a differential compensation module, a modulation module, a demodulation module, a regulation module, an analog-to-digital converter (ADC), and a control module, wherein the modulation module comprises a modulation circuit and a modulation-dedicated winding; and the demodulation module comprises a demodulation-dedicated winding and a demodulation circuit;

the control module is separately connected to the primary current source, the secondary current source, the integer-turn drive module, the fractional-turn drive module, the differential compensation module, and the ADC;

the primary current source comprises a reference digital-to-analog converter (DAC) and a transconductance amplifier; the reference DAC receives a code value from the control module and outputs a voltage corresponding to the code value to the transconductance amplifier; the transconductance amplifier converts a voltage signal output by the reference DAC into a current signal; a sampling resistor in the transconductance amplifier is switched through a switch to switch a current range; and a structure of the secondary current source is the same as a structure of the primary current source;

the standard resistor terminal and the secondary-loop fixed-turn winding are connected in a secondary loop in which the secondary current source is located; and the standard resistor terminal is configured to connect an external standard resistor, a standard resistor substitution relay, or a secondary loop standby resistor;

the to-be-tested resistor terminal, the primary-loop integer-turn adjustable winding, the primary-loop fractional-turn adjustable winding, and the differential compensation module are connected in a primary loop in which the primary current source is located; and the to-be-tested resistor terminal is configured to connect an external to-be-tested resistor, a to-be-tested resistor substitution relay, or a primary loop standby resistor;

the iron core is configured to wind the primary-loop integer-turn adjustable winding, the primary-loop fractional-turn adjustable winding, the secondary-loop fixed-turn winding, the modulation-dedicated winding, and the demodulation-dedicated winding;

the integer-turn switch matrix is separately connected to the integer-turn drive module and the primary-loop integer-turn adjustable winding; and the integer-turn drive module is configured to provide a drive signal for the integer-turn switch matrix under a control instruction of the control module, to connect different turns of windings of the primary-loop integer-turn adjustable winding to the primary loop;

the fractional-turn switch matrix is separately connected to the fractional-turn drive module and the primary-loop fractional-turn adjustable winding; and the fractional-turn drive module is configured to provide a drive signal for the fractional-turn switch matrix under a control instruction of the control module, to connect different turns of windings of the primary-loop fractional-turn adjustable winding to the primary loop;

the differential compensation module is configured to extract a primary loop current from the primary loop, and output a primary loop current to the primary-loop fractional-turn adjustable winding after proportional attenuation;

the modulation circuit is connected to the modulation-dedicated winding; and the modulation module is configured to modulate a residual magnetic flux in the iron core, and generate a modulated detection signal;

the demodulation circuit is connected to the demodulation-dedicated winding; and the demodulation module is configured to demodulate the modulated detection signal into a DC voltage signal;

the regulation module is separately connected to the demodulation circuit and the ADC; and the regulation module is configured to filter and amplify the DC voltage signal output by the demodulation module, and output a regulated voltage signal to the ADC;

the ADC is configured to sample the regulated voltage signal and send sampled data to the control module; and the control module is configured to calculate correction values corresponding to the primary current source and the secondary current source based on the sampled data, and correct, based on the correction values, code values received by the primary current source and the secondary current source, to complete self-calibration of the primary current source and the secondary current source.

2. The DCC bridge according to claim 1, wherein the reference DAC uses a single DAC device.

3. The DCC bridge according to claim 1, wherein the reference DAC uses a composite DAC comprising a dual DAC and a proportional adder; and the dual DAC comprises a first DAC and a second DAC, and the first DAC and the second DAC are respectively denoted as a DACa and a DACb.

4. A current source self-calibration method for a direct current comparator (DCC) bridge, the DCC bridge comprising: a primary current source having a reference digital-to-analog converter (DAC) and a transconductance amplifier, a secondary current source having a reference DAC and a transconductance amplifier, a standard resistor terminal, a to-be-tested resistor terminal, an iron core, a primary-loop integer-turn adjustable winding, an integer-turn switch matrix, an integer-turn drive module, a primary-loop fractional-turn adjustable winding, a fractional-turn switch matrix, a fractional-turn drive module, a secondary-loop fixed-turn winding, a differential compensation module, a modulation module, a demodulation module, a regulation module, an analog-to-digital converter (ADC), and a control module, wherein the modulation module comprises a modulation circuit and a modulation-dedicated winding; and the demodulation module comprises a demodulation-dedicated winding and a demodulation circuit;

wherein the current source self-calibration method comprises step 1: switching the integer-turn switch matrix, so that an integer quantity of turns of the primary-loop integer-turn adjustable winding is equal to a fixed quantity of turns of the secondary-loop fixed-turn winding; and switching the fractional-turn switch matrix, so that a fractional quantity of turns of the primary-loop fractional-turn adjustable winding is 0;

step 2: switching the primary current source and the secondary current source to a same current range, short-circuiting the to-be-tested resistor terminal or connecting the to-be-tested resistor terminal to a primary loop standby resistor through a to-be-tested resistor substitution relay, and short-circuiting the standard resistor terminal or connecting the standard resistor terminal to a secondary loop standby resistor through a standard resistor substitution relay;

step 3: denoting the reference DAC of the primary current source as a DAC1 and the reference DAC of the secondary current source as a DAC2, dividing a quantity N of bits of each of the DAC1 and the DAC2 into two parts of high-order bits $N_H$ and low-order bits $N_L$, and initializing values of all the N bits of each of the DAC1 and the DAC2 to 0;

step 4: refreshing output voltages of the DAC1 and the DAC2 based on currently received code values, and respectively outputting, by the primary current source and the secondary current source under driving of the output voltages of the DAC1 and the DAC2, currents to a primary loop and a secondary loop;

step 5: reading sampled data through the ADC, wherein a reading is denoted as $D_{(i)(j)}$ a subscript i represents a current high-order code value of the DAC1, a subscript j represents a current high-order code value of the DAC2, and $0 \le i, j \le 2^{N_H}-1$;

step 6: if $0 \le j < 2^{N_H}-1$ currently, performing step 7; or if $j=2^{N_H}-1$ currently, ending the round of cycle and proceeding to step 8;

step 7: if i=j currently, increasing the code value of the DAC1 by 1, that is, i=i+1, and keeping j unchanged; or if i is not equal to j, increasing the code value of the DAC2 by 1, that is, j=j+1, and keeping i unchanged; and proceeding to step 4;

step 8: after the round of cycle ends, collecting a total of $(2\times2^{N_H})$ pieces of sampled data by the ADC, wherein the (2×2NH) pieces of sampled data are denoted as $$D_{(0)(0)}, D_{(1)(0)}, D_{(1)(1)}, D_{(2)(1)}, \ldots , D_{(2^{N_H-1})(2^{N_H-2})}, D_{(2^{N_H-1})(2^{N_H-1})};$$

step 9: obtaining first $(2\times2^{N_H}-1)$ pieces of sampled data from the $(2\times2^{N_H})$ pieces of sampled data, grouping the first $(2\times2^{N_H}-1)$ pieces of sampled data sequentially into pairs, and subtracting a former value from a latter value in each group, to calculate a difference $d_{2,k}=D_{(k+1)(k)}-D_{(k)(k)}$ between every two pieces of adjacent sampled data, wherein a value of k ranges from 0 to $2^{N_H}-2$, k is an integer, and a total of $(2^{N_H}-1)d_{2,k}$ are calculated;

step 10: summing the $(2^{N_H}-1)$ $d_{2,k}$, and performing calculation to obtain $$S_2 = \sum\nolimits_{k=0}^{2^{N_H-2}} d_{2,k};$$

step 11: calculating a differential non-linearity (DNL) error $e_{2,k}$ between adjacent high-order code values of the DAC2 based on $d_{2,k}$ and $S\mathbf{2}_i$ step 12: calculating a correction value $c_{2,k}$ of the DAC2 based on $e_{2,k}$;

step 13: obtaining last $(2\times2^{N_H}-1)$ pieces of sampled data from the $(2\times2^{N_H})$ pieces of sampled data, grouping the last $(2\times2^{N_H}-1)$ pieces of sampled data sequentially into pairs, and subtracting a former value from a latter value in each group, to calculate a difference $d_{1,k}=D_{(k)(k)}-D_{(k)(k-1)}$ between every two pieces of adjacent sampled data, wherein a value of k ranges from 1 to $2^{N_H}-1$, and a total of $(2^{N_H}-1)$ $d_{1,k}$ are calculated;

step 14: summing the $(2^{N_H}-1)$ $d_{1,k}$, and performing calculation to obtain $$S_1 = \sum\nolimits_{k=1}^{2^{N_H-1}} d_{1,k};$$

step 15: calculating a DNL error $e_{1,k}$ between adjacent high-order code values of the DAC1 based on $d_{1,k}$ and $S_1$;

step 16: calculating a correction value $c_{1,k}$ of the DAC1 based on $e_{1,k}$; and step 17: when the DCC bridge is in a conventional measurement mode, respectively correcting, by using the correction values $c_{1,k}$ and $c_{2,k}$, code values received by the primary current source and the secondary current source.

5. The current source self-calibration method according to claim 4, wherein the calculating the DNL error $e_{2,k}$ between adjacent high-order code values of the DAC2 based on $d_{2,k}$ and $S_2$ in step 11 specifically comprises:

$$e_{2,k} = \frac{d_{2,k}\cdot(2^N H - 1) - S_2}{S_2}.$$

6. The current source self-calibration method according to claim 4, wherein the calculating the correction value $c_{2,k}$ of the DAC2 based on $e_{2,k}$ in step 12 specifically comprises:

$$c_{1,k} = \begin{cases} 0, k = 0 \text{ or } 2^{N_H} - 2 \\ -2^{N_L}\cdot\sum e_{2,k}, 0 < k < 2^{N_H} - 2 \end{cases}.$$

7. The current source self-calibration method according to claim 4, wherein the calculating the DNL error $e_{1,k}$ between adjacent high-order code values of the DAC1 based on $d_{1,k}$ and $S_1$ in step 15 specifically comprises:

$$e_{1,k} = \frac{d_{1,k}\cdot(2^N H - 1) - S_1}{S_1}.$$

8. The current source self-calibration method according to claim 4, wherein the calculating the correction value $c_{1,k}$ of the DAC1 based on $e_{1,k}$ in step 16 specifically comprises:

$$c_{1,k} = \begin{cases} 0, k = 1 \text{ or } 2^{N_H} - 1 \\ -2^{N_L}\cdot\sum e_{1,k}, 1 < k < 2^{N_H} - 1 \end{cases}.$$

9. The current source self-calibration method according to claim 4, wherein the dividing the quantity N of bits of each of the DAC1 and the DAC2 into two parts of high-order bits NH and low-order bits $N_L$ in step 3 specifically comprises:

when the reference DAC uses a single DAC device, determining the low-order bits $N_L$ in the quantity N of bits according to a formula $2^{N_L-1}<INL<2^{N_L}$, and the rest of the quantity N of bits as the high-order bits NH, wherein INL is a maximum integral non-linearity error of the reference DAC.

10. The current source self-calibration method according to claim 4, wherein the dividing the quantity N of bits of each of the DAC1 and the DAC2 into two parts of high-order bits $N_H$ and low-order bits $N_L$ in step 3 specifically comprises:

when the reference DAC uses a composite DAC comprising a dual DAC and a proportional adder, if a resistance ratio of the proportional adder is $1/2^m$, using an effective quantity of bits of a DACa as the high-order bits $N_H$, and using m as the low-order bits $N_L$, to form the reference DAC with total bits $N=N_H+N_L$.

11. The current source self-calibration method according to claim 4, wherein the reference DAC uses a single DAC device.

12. The current source self-calibration method according to claim 4, wherein the reference DAC uses a composite DAC comprising a dual DAC and a proportional adder; and the dual DAC comprises a first DAC and a second DAC, and the first DAC and the second DAC are respectively denoted as a DACa and a DACb.

* * * * *